(12) United States Patent
Yoshimi et al.

(10) Patent No.: US 7,132,607 B2
(45) Date of Patent: Nov. 7, 2006

(54) WIRED CIRCUIT BOARD

(75) Inventors: Takeshi Yoshimi, Osaka (JP); Tetsuya Osawa, Osaka (JP)

(73) Assignee: Nitto Denko Corporation, Ibaraki (JP)

( * ) Notice: Subject to any disclaimer, the term of this patent is extended or adjusted under 35 U.S.C. 154(b) by 224 days.

(21) Appl. No.: 10/860,491

(22) Filed: Jun. 4, 2004

(65) Prior Publication Data

US 2004/0245015 A1 Dec. 9, 2004

(30) Foreign Application Priority Data

Jun. 4, 2003 (JP) .............................. 2003-159134

(51) Int. Cl.
*H05K 1/03* (2006.01)

(52) U.S. Cl. ....................... 174/255; 174/258; 174/260

(58) Field of Classification Search ......... 174/255–266
See application file for complete search history.

(56) References Cited

U.S. PATENT DOCUMENTS

| | | | | |
|---|---|---|---|---|
| 5,857,257 A * | 1/1999 | Inaba | ...................... | 29/603.04 |
| 6,399,899 B1 * | 6/2002 | Ohkawa et al. | ............. | 174/261 |
| 6,846,991 B1 * | 1/2005 | Girard et al. | ............... | 174/250 |

| | | | |
|---|---|---|---|
| 2003/0146446 A1 * | 8/2003 | Yamazaki et al. | |
| 2005/0061542 A1 * | 3/2005 | Aonuma et al. | |

FOREIGN PATENT DOCUMENTS

| | | |
|---|---|---|
| JP | 2001-044581 | 2/2001 |
| JP | 2003-069170 | 3/2003 |

* cited by examiner

*Primary Examiner*—Kamand Cuneo
*Assistant Examiner*—Yuriy Semenenko
(74) *Attorney, Agent, or Firm*—Jean C. Edwards, Esq.; Akerman Senterfitt

(57) ABSTRACT

A wired circuit board is provided having enhanced reliability of electrical connection between a metal substrate and a shield layer to achieve significant noise reduction reliably. An insulating base layer is formed on the metal substrate, while resin layers are formed on the metal substrate with a predetermined space provided from the both widthwise sides of the insulating base layer. A conductor layer is formed having a predetermined wired circuit pattern on the insulating base layer. Thereafter, an insulating cover layer is formed on the insulating base layer in such a manner as to cover the conductor layer. Then, a shield layer is laminated on the metal substrate to cover the insulating cover layer and also is put in close contact with the resin layers at end portions thereof by a vacuum film-forming method or by plating.

10 Claims, 7 Drawing Sheets

(e)

(f)

(g)

(h)

WIRED CIRCUIT BOARD

This application claims priority from Japanese Patent Application No. 2003-159134, filed Jun. 4, 2003, the entire contents of which are herein incorporated by reference to the extent allowed by law.

BACKGROUND OF THE INVENTION

1. Field of the Invention

The present invention relates to a wired circuit board and, more particularly, to a flexible wired circuit board with a metal substrate having a shield layer formed thereon.

2. Description of the Prior Art

Along with an increasing demand for size reduction and high integration of an electric device or an electronic device in recent years, required qualities for a flexible wired circuit board with a metal substrate, such as, for example, finer pattern of the wired circuit and higher thickness precision constituent material, are increasingly becoming severe.

The finer the wired circuit pattern becomes, the higher and weaker the signal frequency becomes particularly in a suspension board with circuit to be mounted on a hard disk drive, so that influence of noise on the signal is increasingly becoming noticeable.

For reduction of noise, proposals have been made such as, for example, arranging a ground wire in the vicinity of the wiring pattern, or widening space between wires of the wiring pattern. However, these proposals are not sufficient for the noise reduction required in these days.

Accordingly, a further proposal has been made for covering an insulating cover layer that covers the wiring with a conductive shield layer in order to achieve the currently required significant noise reduction.

For example, Japanese Laid-open (Unexamined) Patent Publication No. 2003-69170 proposes improvement of a printed board comprising (i) a signal conductor and (ii) a ground conductor extending along the signal conductor, which are formed on a substrate in the form of wiring pattern, and (iii) an insulating layer to cover the wiring patterns, wherein a non-insulating section is formed in the insulating layer to expose a part of the ground conductor therefrom, and also a conductor layer is formed to cover the insulating layer over the signal conductor and is brought into conduction with the ground conductor via the non-insulating section, so that unwanted radiation is reduced.

Also, in the suspension board with circuit, when a conductive shield layer is formed to cover the insulating cover layer by plating or the like so as to be electrically connected to the metal substrate, the effect of significant noise reduction can be provided.

However, JP Unexamined Patent Publication No. 2003-69170 cited above has the disadvantage that since the conductor layer is formed by a conductive tape or film, the conductor layer strips off too easily.

On the other hand, in the suspension board with circuit mentioned above, when the shield layer is formed by plating or the like, the shield layer is well contacted with the insulating cover layer, but is poorly contacted with the metal substrate, so that the shield layer strips from the metal substrate gradually from an end thereof.

SUMMARY OF THE INVENTION

It is the object of the present invention to provide a wired circuit board that can provide enhanced reliability of electrical connection between a metal substrate and a shield layer to achieve significant noise reduction reliably.

The present invention provides a novel wired circuit board that includes: a metal substrate, an insulating base layer formed on the metal substrate, a conductor layer formed on the insulating base layer, an insulating cover layer, formed on the insulating base layer, for covering the conductor layer, a shield layer covering the insulating cover layer and connected to the metal substrate, the shield layer being formed by plating and/or by a vacuum film-forming method, and a resin layer formed on the metal substrate and contacted with the shield layer at its end portions on the opposite side of the insulating cover layer to a connecting portion of the shield layer with the metal substrate.

According to the present invention, the shield layer covering the insulating cover layer and connected to the metal substrate is closely contacted with the resin layers at its end portions on the opposite side of the insulating cover layer to the connecting portion of the shield layer with the metal substrate. This can produce the advantageous result that even when the shield layer is formed by plating or by a vacuum film-forming method, the shield layer can be closely contacted with the resin layers at end portions thereof in a reliable manner. This can prevent the shield layer from stripping from the end portions thereof so as to ensure a reliable connection of the shield layer with the metal substrate at the connecting portion thereof. This can provide enhanced reliability of electrical connection between the metal substrate and the shield layer to achieve significant noise reduction reliably.

Figure 2:
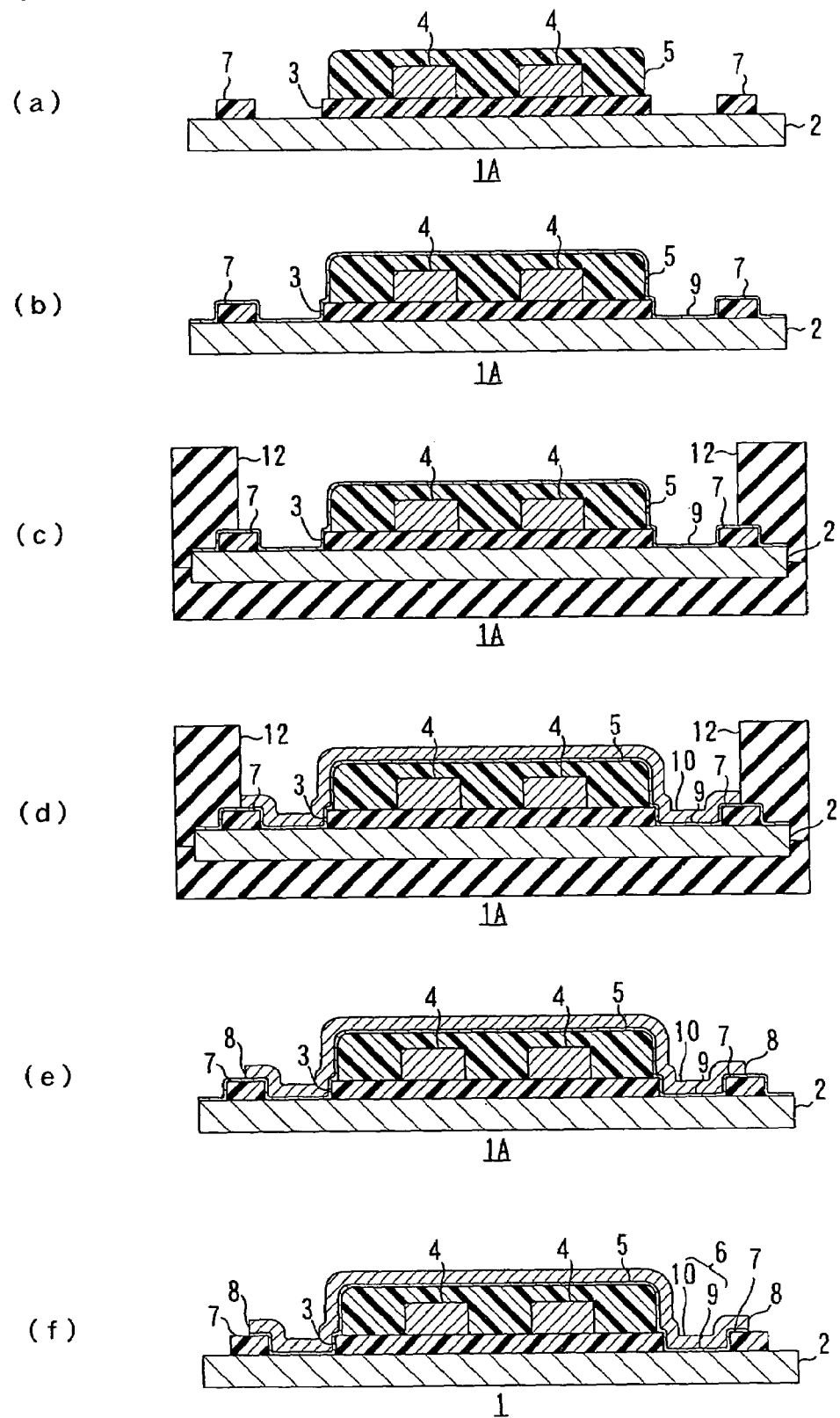
Figure 3:
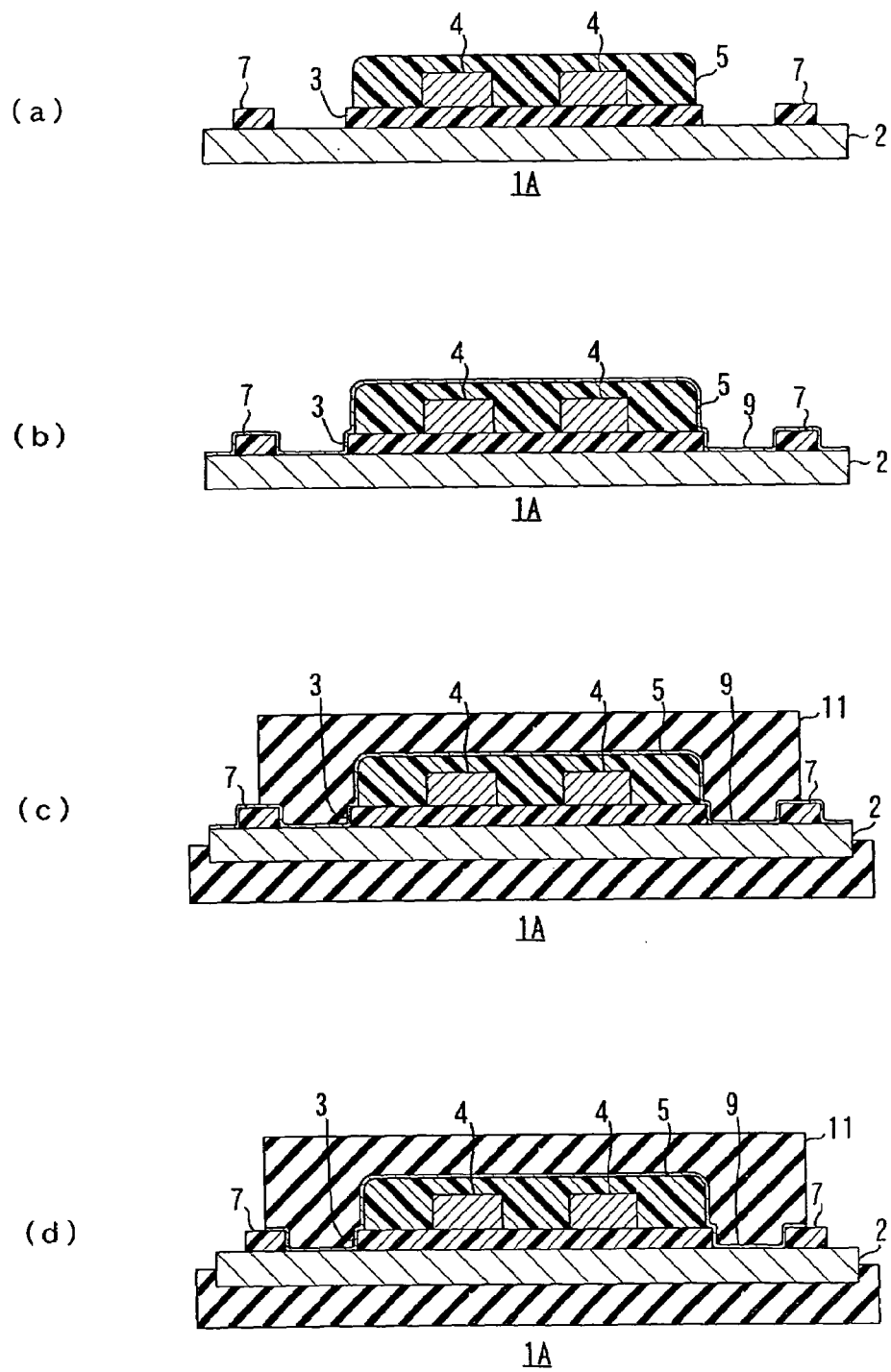
Figure 4:
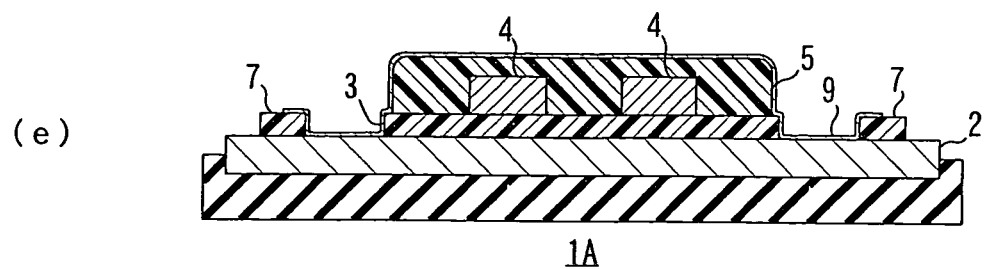
Figure 4:
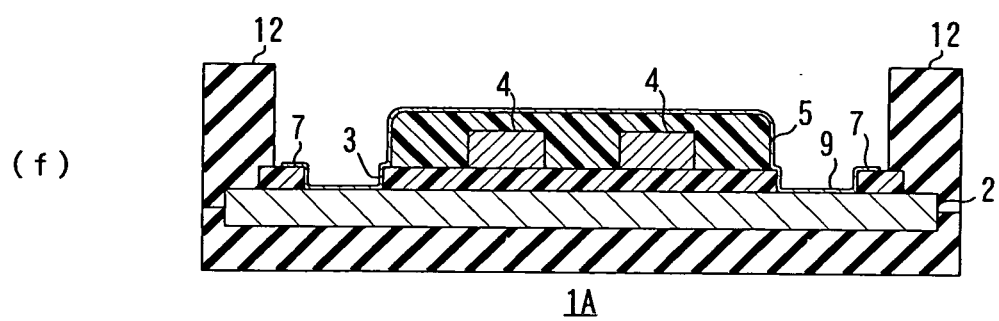
Figure 4:
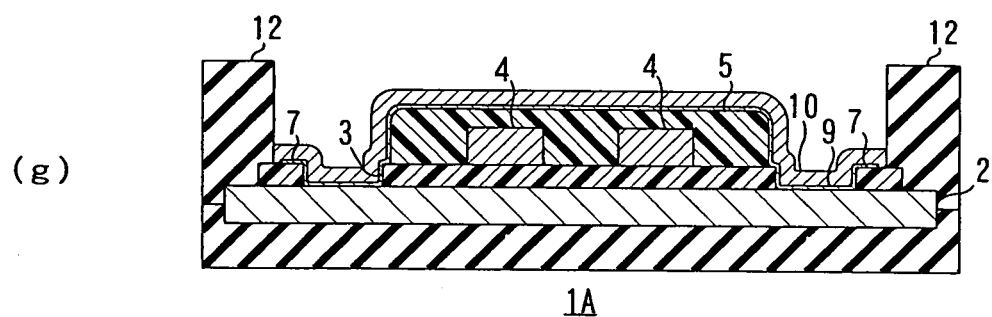
Figure 4:
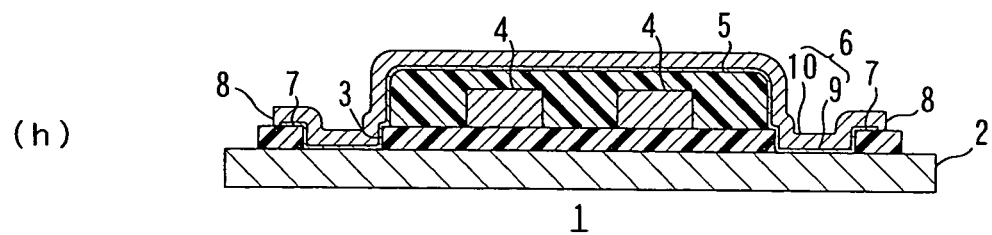
Figure 5:
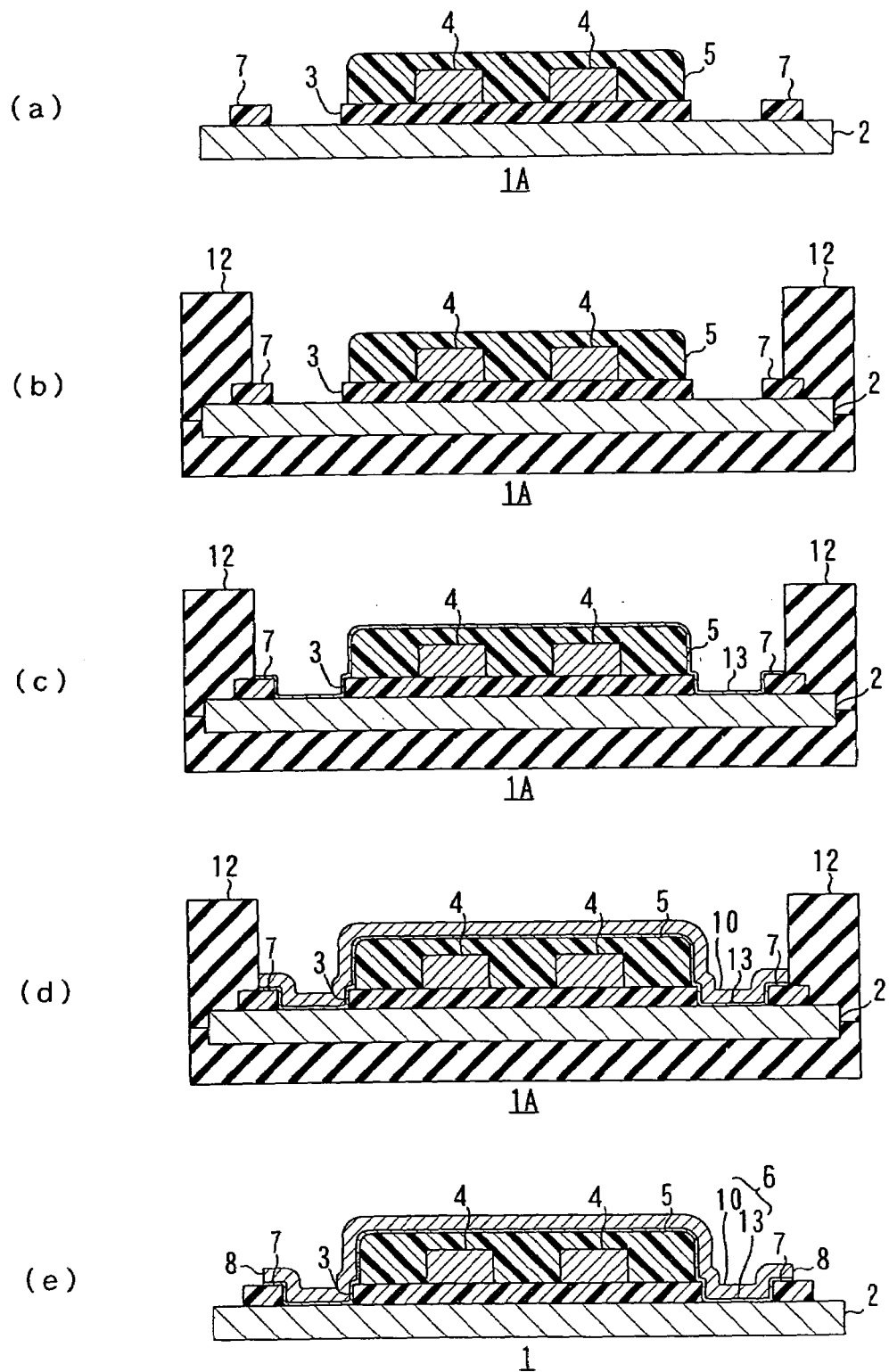
Figure 6:
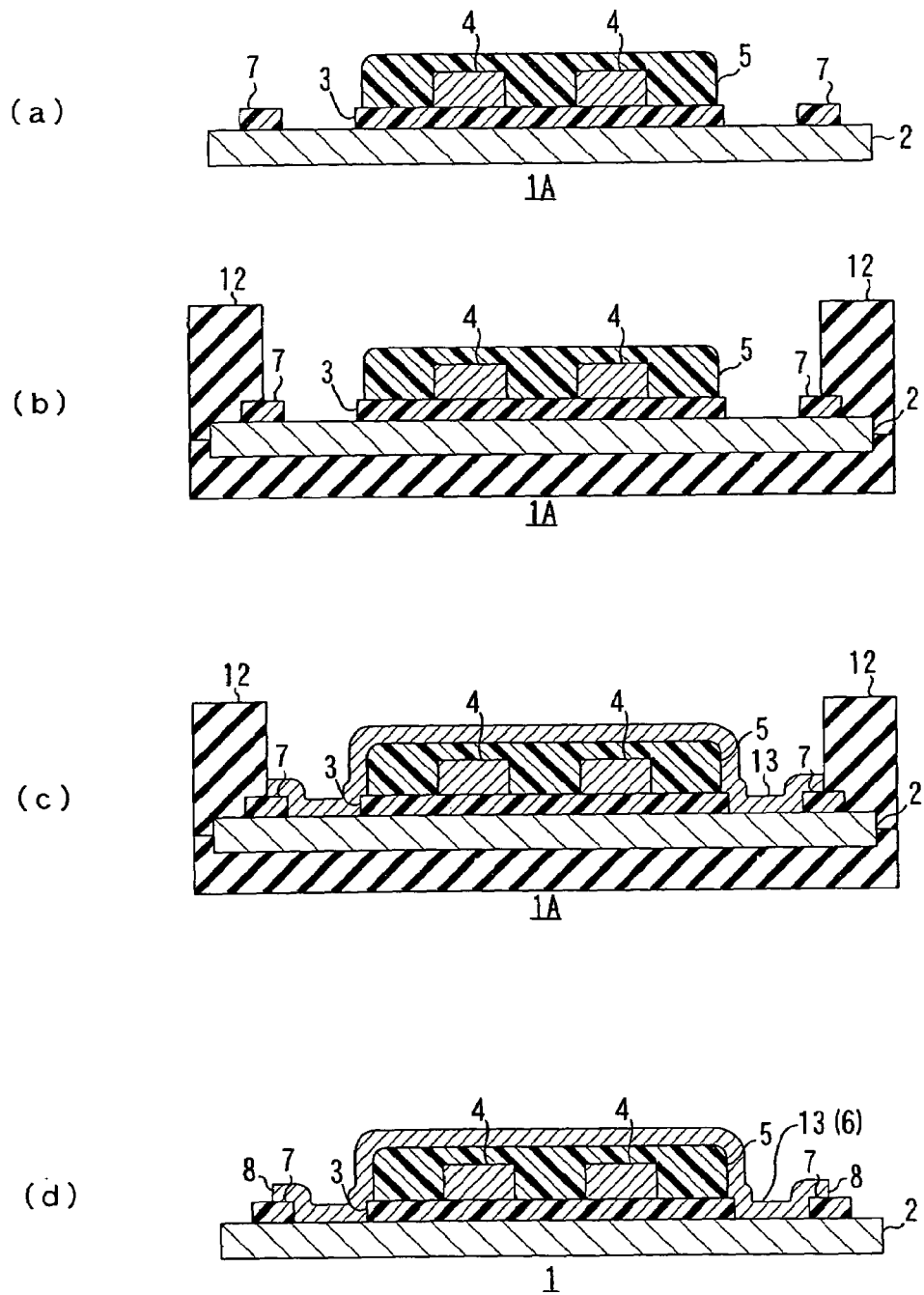
Figure 7:
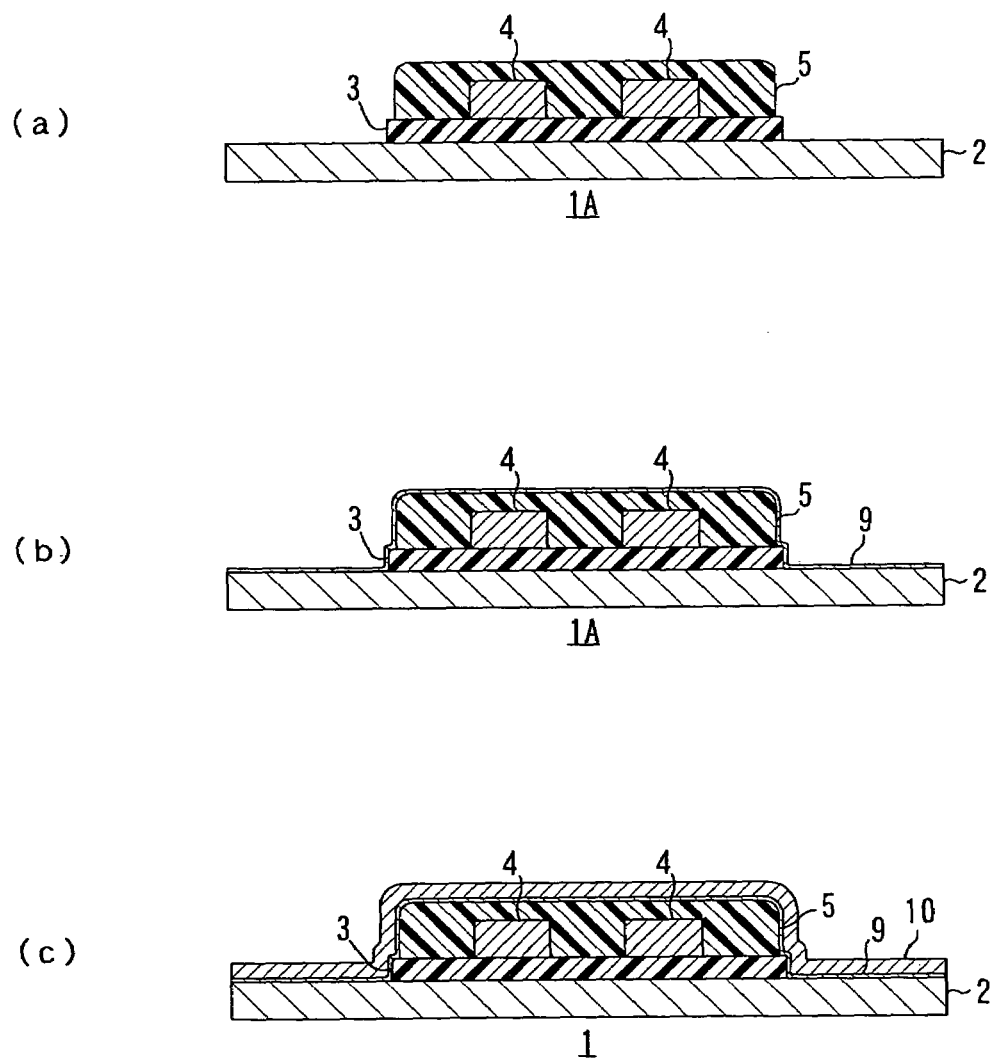

(a) shows the step of preparing a wired circuit board before a shield layer is formed;

(b) shows the step of forming a thin conductor film, which serves as a ground layer, over an entire surface of a metal substrate including an insulating cover layer and resin layers;

(c) shows the step of forming an electrolytic plated layer on the thin conductor film by electrolytic plating;

(d) shows the step of covering the wired circuit board with an etching resist, to expose an unnecessary part except a shield layer forming part;

(e) shows the step of removing the unnecessary part exposed from the etching resist by etching; and (f) shows the step of removing the etching resist, FIG. 2 shows the production processes of another embodiment illustrating a method of producing a wired circuit board of the present invention:

(a) shows the step of preparing a wired circuit board before a shield layer is formed;

(b) shows the step of forming a thin conductor film, which serves as a ground layer, over an entire surface of a metal substrate including an insulating cover layer and resin layers;

(c) shows the step of forming a plating resist on a part of the thin conductor film corresponding to a reversed part of a shield layer forming part on the thin conductor film;

(d) shows the step of forming an electrolytic plated layer by electrolytic plating on the thin conductor film exposed from the plated resist;

(e) shows the step of removing the plating resist; and (f) shows the step of removing the thin conductor film on which the plating resist was formed, FIG. 3 shows the production processes of a yet another embodiment illustrating a method of producing a wired circuit board of the present invention:

(a) shows the step of preparing a wired circuit board before a shield layer is formed;

(b) shows the step of forming a thin conductor film, which serves as a ground layer, over an entire surface of a metal substrate including an insulating cover layer and resin layers;

(c) shows the step of forming an etching resist on a shield layer forming part of the thin conductor film; and (d) shows the step of removing the thin conductor film exposed from the etching resist by etching, FIG. 4 shows the production processes sequent to the production processes of FIG. 3 of the yet another embodiment illustrating the method of producing the wired circuit board of the present invention:

(e) shows the step of removing the etching resist;

(f) shows the step of forming a plating resist on a part of the thin conductor film corresponding to a reversed part of a shield layer forming part on the thin conductor film;

(g) shows the step of forming an electrolytic plated layer by electrolytic plating on the thin conductor film exposed from the plating resist; and (h) shows the step of removing the plating resist, FIG. 5 shows the production processes of a still another embodiment illustrating a method of producing a wired circuit board of the present invention:

(a) shows the step of preparing a wired circuit board before a shield layer is formed;

(b) shows the step of forming a plating resist on a part of a metal substrate corresponding to a reversed part of a shield layer forming part on the metal substrate including an insulating cover layer and resin layers;

(c) shows the step of forming an electroless plated layer, which serves as a ground layer, by electroless plating on the metal substrate including the insulating cover layer and the resin layers exposed from the plating resist;

(d) shows the step of forming an electrolytic plated layer on the electroless plated layer by electrolytic plating; and (e) shows the step of removing the plating resist, FIG. 6 shows the production processes of a further embodiment illustrating a method of producing a wired circuit board of the present invention:

(a) shows the step of preparing a wired circuit board before a shield layer is formed;

(b) shows the step of forming a plating resist on a part of a metal substrate corresponding to a reversed part of a shield layer forming part on the metal substrate including an insulating cover layer and resin layers;

(c) shows the step of forming an electroless plated layer by electroless plating on the metal substrate including the insulating cover layer and the resin layers exposed from the plating resist; and (d) shows the step of removing the plating resist, and FIG. 7 shows the production processes of a method of producing a wired circuit board of Comparative Example 1:

(a) shows the step of preparing a wired circuit board before a shield layer is formed (no resin layer being formed);

(b) shows the step of forming a thin metal film on an entire surface of the metal substrate including an insulating cover layer; and (c) shows the step of forming an electrolytic plated layer on the thin conductor film by electrolytic plating.

DETAILED DESCRIPTION OF THE INVENTION

Figure 1:
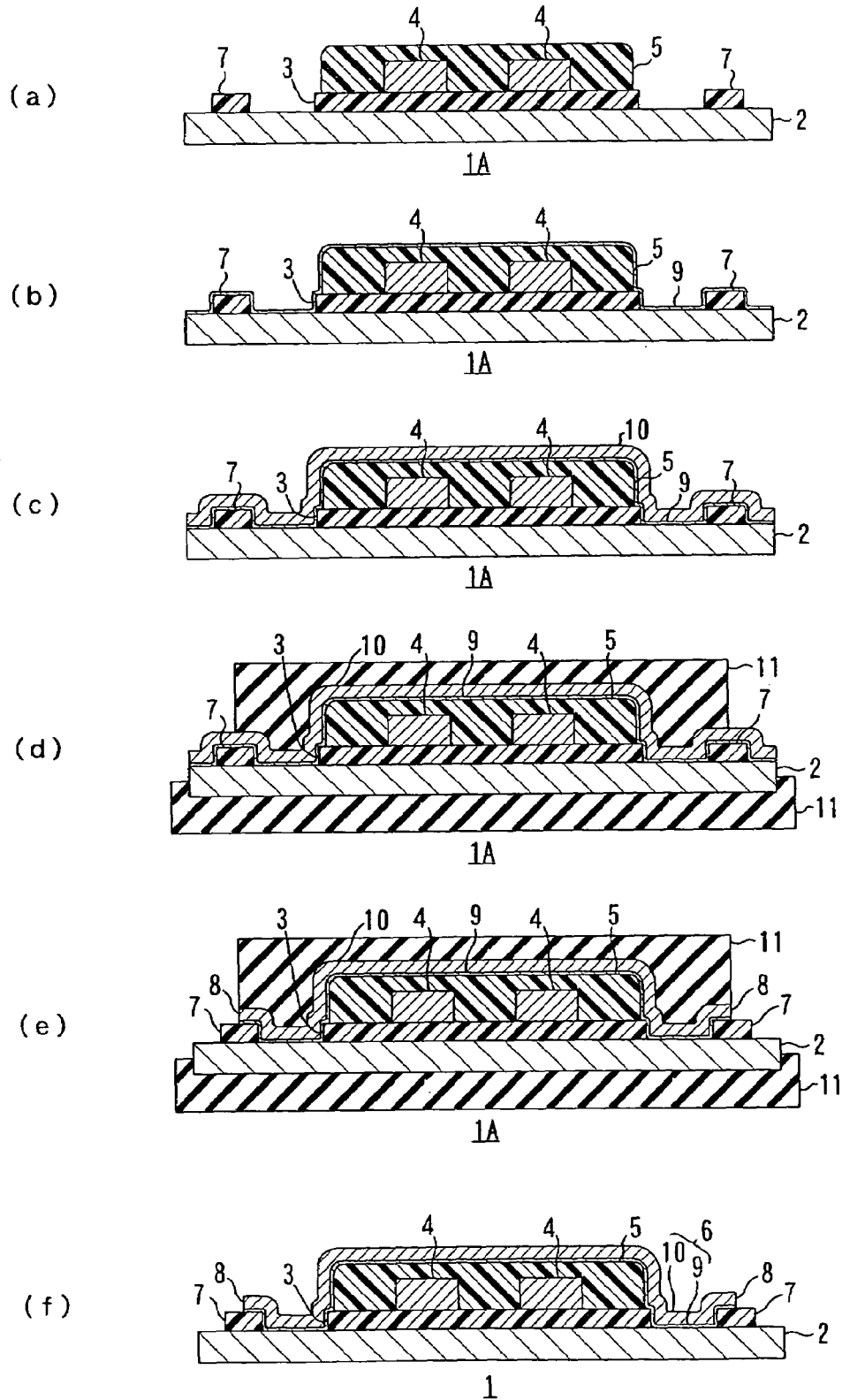
FIG. 1 shows the production processes of an embodiment illustrating a method of producing a wired circuit board of the present invention.

Referring to FIG. 1(*f*), there is shown a sectional view of an embodiment of a wired circuit board of the present invention. A wired circuit board 1 shown in FIG. 1(*f*) is a flexible wired circuit board with a metal substrate used as a suspension board with circuit and the like, for example, comprising a metal substrate 2, an insulating base layer 3 formed on the metal substrate 2, a conductor layer 4 formed on the insulating base layer 3, and an insulating cover layer 5 formed on the insulating base layer 3 for covering the conductor layer 4.

The metal substrate 2 is a thin metal foil or a thin metal sheet of conductive metal. For example, stainless, copper, aluminum, copper-beryllium, phosphor bronze, and 42 alloy may be used for the metal substrate 2. Stainless is preferably used, in view of characteristic of spring and corrosion resistance. It is preferable that the metal substrate 2 usually has a thickness in the range of 10–60 µm, or preferably 15–30 µm and a width in the range of 50–500 µm, or preferably 125–300 µm.

The insulating base layer 3 and the insulating cover layer 5 are formed of insulating material. The insulating materials that may be used for the insulating layers, for example, synthetic resin, such as polyimide resin, acrylic resin, polyether nitrile resin, polyether sulfonic resin, polyethylene terephthalate resin, polyethylene naphthalate resin, and polyvinyl chloride resin. Of these insulating materials, photosensitive resin is preferably used. Photosensitive polyimide resin is further preferably used.

It is preferable that the insulating base layer 3 usually has a thickness in the range of 1–20 µm, or preferably 5–15 µm, and the insulating cover layer 5 usually has a thickness in the range of 1–10 µm, or preferably 2–7 µm.

The conductor layer 4 is formed of conductive material. The conductive materials that may be used include, for example, metals, such as copper, nickel, gold, solder, or alloys thereof. Copper is preferably used. The conductor layer 4 usually has a thickness in the range of 2–30 µm, or preferably 5–20 µm.

The wired circuit board 1 comprises a shield layer 6 covering the insulating cover layer 5 and connected to the metal substrate 2, and a resin layer 7 formed on the metal substrate 2 and contacted with the shield layer 6 at its end portions 8 on the opposite side of the insulating cover layer 5 across a connecting portion of the shield layer 6 with the metal substrate 2.

The shield layer 6 covers an upper surface and widthwise (a direction orthogonal to a longitudinal direction of the wired circuit board 1, or lateral sides when viewed in the paper) side surfaces of the insulating cover layer 5. Further, the shield layer 6 extends from both side surfaces to widthwise outward direction of the insulating cover layer 5, whereby it is laminated on the metal substrate 2 to be connected thereto and also is closely contacted with an upper surface of the resin layer 7 at both widthwise end portions 8 thereof. The shield layer 6 is formed of conductive material. For example, metals, such as copper, chromium, nickel, gold, silver, platinum, palladium, titanium, tantalum, solder, or alloys thereof may be used for the shield layer 6. It is preferable that the shield layer 6 usually has a thickness in the range of 0.2–5 m, or preferably 0.5–4 m. The shield layer 6 is formed by a plating method, such as electrolytic plating or electroless plating, or by a vacuum film-forming method, such as sputtering, vacuum deposition, or ion plating.

The resin layer 7 is formed in the form of two long and narrow strips of resin on the metal substrate 2. The two strips of resin are located at both widthwise outward sides of the insulating cover layer 5 and are spaced from the insulating base layer 3 and the insulating cover layer 5 at a predetermined distance (0.05–5 mm, or preferably 0.1–3 mm) and arranged in parallel with the insulating cover layer 5 in the longitudinal direction of the wired circuit board 1. It is preferable that the resin layer 7 usually has a thickness in the range of 1–20 m, or preferably 5–15 m and a width in the range of 20–1,000 m, or preferably 50–500 m. Each resin layer 7 is formed to have any desirable length in the longitudinal direction of the wired circuit board 1, depending on its intended purposes and use.

This wired circuit board 1 may be produced by various methods mentioned below, without any particular limitation.

For example, a wired circuit board 1A having the insulating base layer 3 formed on the metal substrate 2, the conductor layer 4 formed on the insulating base layer 3, the insulating cover layer 5 formed on the insulating base layer 3 to cover the conductor layer 4, and the respective resin layers 7 formed on the metal substrate 2 (i.e. a wired circuit board 1 before the shield layer 6 being formed) is prepared, first, as shown in FIG. 1(a).

This wired circuit board 1A can be formed in the following processes, for example, though not shown.

First, the insulating base layer 3 and the respective resin layers 7 are formed on the metal substrate 2.

The insulating base layer 3 and the respective resin layers 7 can be formed on the metal substrate 2 in the following method, for example. Solution of photosensitive resin, such as solution of photosensitive polyamic acid resin, is applied to a surface of the metal substrate 2 and then is exposed to light and developed, thereby forming the insulating base layer 3 and the respective resin layers 7 into a predetermined pattern. Thereafter, it is dried and cured. Alternatively, an insulative film previously formed into a shape corresponding to the form of the insulating base layer 3 and the resin layers 7 may be adhesively bonded to the surface of the metal substrate 2 via an adhesive layer, if necessary.

Then, the conductor layer 4 is formed on the insulating base layer 3. The conductor layer 4 is formed in the form of a predetermined wired circuit pattern by a known patterning process, such as an additive process, a semi-additive process, or a subtractive process. The conductor layer 4 may be covered with an electroless nickel plated layer by the electroless nickel plating, if necessary.

Thereafter, the insulating cover layer 5 is formed on the insulating base layer 3 in such a manner as to cover the conductor layer 4. For example when the insulating cover layer 5 is formed on the insulating base layer 3, solution of photosensitive resin, such as solution of photosensitive polyamic acid resin, is applied to a surface of the insulating base layer 3 including the conductor layer 4 and then is exposed to light and developed, thereby forming the photosensitive resin into a predetermined pattern. Thereafter, it is dried and cured. Alternatively, an insulative film previously formed into a shape corresponding to the form of the insulating cover layer 5 may be adhesively bonded to the surface of the insulating base layer 3 including the conductor layer 4 via an adhesive layer, if necessary. The wired circuit board 1A can be prepared in this manner.

Then, the shield layer 6 is formed in the processes shown in FIG. 1(b)–(f).

First, a thin conductor film 9 which serves as a ground layer is formed on an entire area of the metal substrate 2 including the insulating cover layer 5 and the resin layers 7, as shown in FIG. 1(b). The vacuum film-forming method, sputtering in particular, is preferably used for forming the thin conductor film 9. The conductive materials that may be used for the thin conductor film 9 include preferably chromium and copper. Specifically, it is preferable that a thin chromium film and a thin copper film are sequentially formed on the entire area of the metal substrate 2 including the insulating cover layer 5 and the resin layers 7 by sputtering. It is preferable that the thin chromium film has a thickness of 300–700 Å and the thin copper film has a thickness of 500–3,000 Å.

Then, an electrolytic plated layer 10 is formed on the thin conductor film 9 by electrolytic plating, as shown in FIG. 1(c). The electrolytic plated layer 10 may be formed in a proper method, without any particular limitation. For example, it is preferable that an electrolytic nickel-plated layer and an electrolytic gold-plated layer are sequentially formed on the thin conductor film 9 by electrolytic nickel plating and electrolytic gold plating.

Then, the wired circuit board 1A is covered with etching resist 11 in such a manner that an unwanted portion of the wired circuit board 1A other than a shield layer 6 forming portion thereof (i.e., portions of the resin layers 7 and metal substrate 2 extending widthwise outwardly from widthwise intermediate portions of the resin layers 7) can be exposed, as shown in FIG. 1(d). The etching resist 11 is formed by a known method using dry film resist, for example.

Then, the unwanted portion exposed from the etching resist 11 is removed by etching, as shown in FIG. 1(e). The unwanted portion is etched by a known etching method such as chemical etching (wet etching).

Thereafter, the etching resist 11 is removed to obtain a wired circuit board 1 with the shield layer 6 comprising the thin conductor film 9 and the electrolytic plated layer 10, as shown in FIG. 1(f).

Alternatively, the shield layer 6 can be formed in another method shown in FIG. 2.

Specifically, the wired circuit board 1A (the wired circuit board 1 before the shield layer 6 being formed) is prepared in the same manner as in FIG. 1(a), first, as shown in FIG. 2(a).

Then, the thin conductor film 9 which serves as the ground layer is formed on the entire area of the metal substrate 2 including the insulating cover layer 5 and the resin layers 7 in the same manner as in FIG. 1(b), as shown in FIG. 2(b).

Then, a plating resist 12 is formed on a portion of the thin conductor film 9 corresponding to a reversed portion of the shield layer 6 forming portion, as shown in FIG. 2(c). The plating resist 12 may be formed in a known method using dry film resist, for example.

Then, the electrolytic plated layer 10 is formed by electrolytic plating on the thin conductor film 9 exposed from the plating resist 12, as shown in FIG. 2(d). The electrolytic plated layer 10 may be formed in a proper method, without any particular limitation. For example, it is preferable that the electrolytic nickel-plated layer and the electrolytic gold-plated layer are sequentially formed on the thin conductor film 9 by electrolytic nickel plating and electrolytic gold plating.

Thereafter, the plating resist 12 is removed by a known etching method, such as chemical etching (wet etching), or by stripping, as shown in FIG. 2(e), and then the thin conductor film 9 on which the plating resist 12 was formed is also removed by a known etching method such as chemical etching (wet etching), as shown in FIG. 2(f). The wired circuit board 1 having the shield layer 6 comprising the thin conductor film 9 and the electrolytic plated layer 10 is produced in the manner mentioned above.

Alternatively, the shield layer 6 can be formed in yet another method shown in FIG. 3.

Specifically, the wired circuit board 1A (the wired circuit board 1 before the shield layer 6 being formed) is prepared in the same manner as in FIG. 1(a), first, as shown in FIG. 3(a).

Then, the thin conductor film 9 which serves as the ground layer is formed on the entire area of the metal substrate 2 including the insulating cover layer 5 and the resin layers 7 in the same manner as in FIG. 1(b), as shown in FIG. 3(b).

Then, the etching resist 11 is formed on the shield layer 6 forming portion of the thin conductor film 9, as shown in FIG. 3(c). The etching resist 11 is formed in a known method using dry film resist, for example.

Then, the thin conductor film 9 exposed from the etching resist 11 is removed by etching, as shown in FIG. 3(d). The thin conductor film 9 is etched by a known etching method, such as chemical etching (wet etching).

Thereafter, the etching resist 11 is removed by a known etching method, such as chemical etching (wet etching), or by peeling, as shown in FIG. 4(e), and then the plating resist 12 is formed on portions of the metal substrate 2 and resin layers 7 corresponding to a reversed portions of the shield layer 6 forming portion thereof, as shown in FIG. 4(f). The plating resist 12 may be formed in the known method using the dry film resist, for example.

Then, the electrolytic plated layer 10 is formed by electrolytic plating on the thin conductor film 9 exposed from the plating resist 12, as shown in FIG. 4(g). The electrolytic plated layer 10 may be formed in a proper method, without any particular limitation. For example, it is preferable that the electrolytic nickel-plated layer and the electrolytic gold-plated layer are sequentially formed on the thin conductor film 9 by electrolytic nickel plating and electrolytic gold plating.

Thereafter, the plating resist 12 is removed by a known etching method, such as chemical etching (wet etching), or by peeling, as shown in FIG. 4(h). The wired circuit board 1 having the shield layer 6 comprising the thin conductor film 9 and the electrolytic plated layer 10 is produced in the manner mentioned above.

In the methods shown in FIGS. 3 and 4, the plating resist 12 may be formed in such a manner that it is spaced from the thin conductor film 9 with a minute space, as shown in FIG. 4(f), so that an end surface of the thin conductor film 9 can be covered with the electrolytic plated layer 10, as shown in FIG. 4(g) and FIG. 4(h). This can provide the advantageous effect of preventing the shield layer 6 from stripping from the end portion 8 thereof further effectively.

The shield layer 6 may alternatively be formed by a method shown in FIG. 5.

Specifically, the wired circuit board 1A (the wired circuit board 1 before the shield layer 6 being formed) is prepared in the same manner as in FIG. 1(a), first, as shown in FIG. 5(a).

Then, the plating resist 12 is formed on a portion of the metal substrate 2 corresponding to a reversed portion of the shield layer 6 forming portion on the metal substrate 2 including the insulating cover layer 5 and the resin layers 7, as shown in FIG. 5(b). The plating resist 12 may be formed in a known method using dry film resist, for example.

Then, the electroless plated layer 13 which serves as the ground layer is formed by electroless plating on the metal substrate 2 including the insulating cover layer 5 and resin layers 7 exposed from the plating resist 12, as shown in FIG. 5(c). The electroless plated layer 13 may be formed in a proper method, without any particular limitation. For example, it is preferable that the electroless nickel-plated layer is formed on the metal substrate 2 by electroless nickel plating.

Then, the electrolytic plated layer 10 is formed on the electroless plated layer 13 by electrolytic plating, as shown in FIG. 5(d). The electrolytic plated layer 10 may be formed in a proper method, without any particular limitation. For example, it is preferable that the electrolytic nickel-plated layer and the electrolytic gold-plated layer are sequentially formed by electrolytic nickel plating and electrolytic gold plating.

Thereafter, the plating resist 12 is removed by a known etching method, such as chemical etching (wet etching), or by peeling, as shown in FIG. 5(e). The wired circuit board 1 having the shield layer 6 comprising the electroless plated layer 13 and the electrolytic plated layer 10 is produced in the manner mentioned above.

The shield layer 6 may be formed by a method shown in FIG. 6.

Specifically, the wired circuit board 1A (the wired circuit board 1 before the shield layer 6 being formed) is prepared in the same manner as in FIG. 1(a), first, as shown in FIG. 6(a).

Then, the plating resist 12 is formed on the portion of the metal substrate 2 corresponding to a reversed portion of the shield layer 6 forming portion including the insulating cover layer 5 and the resin layers 7, as shown in FIG. 6(b). The plating resist 12 may be formed in a known method using dry film resist, for example.

Then, the electroless plated layer 13 is formed by electroless plating on the metal substrate 2 including the insulating cover layer 5 and resin layers 7 exposed from the plating resist 12, as shown in FIG. 6(c). The electroless plated layer 13 may be formed in a proper method, without any particular limitation. For example, it is preferable that the electroless nickel-plated layer is formed on the metal substrate 2 by electroless nickel plating.

Thereafter, the plating resist 12 is removed by a known etching method, such as chemical etching (wet etching), or by peeling, as shown in FIG. 6(d). The wired circuit board 1 having the shield layer 6 comprising the electroless plated layer 13 only is produced in the manner mentioned above.

In the wired circuit board 1 thus obtained, the shield layer 6 covering the insulating cover layer 5 and connected to the metal substrate 2 is closely contacted with the resin layers 7 at its end portions 8 of the opposite side of the insulating cover layer 5 to the connecting portion (contacting portion) of the shield layer 6 with the metal substrate 2. This can produce the advantageous result that even when the shield layer 6 is formed by plating or by vacuum film-forming method, the shield layer 6 can be closely contacted with the resin layers 7 at widthwise end portions 8 thereof in a reliable manner. This can well prevent the shield layer 6 from stripping from the end portions 8 thereof so as to ensure a reliable connection (close-contact) of the shield layer 6 with the metal substrate 2 at a connecting portion thereof extending from both widthwise sides of the insulating cover layer 5 to the resin layers 7. This can provide enhanced reliability of electrical connection between the metal substrate 2 and the shield layer 6 to achieve significant noise reduction reliably.

EXAMPLES

While in the following, the present invention will be described in further detail with reference to Examples and Comparative Examples, the present invention is not limited to any Examples and Comparative Examples.

Example 1

Solution of polyamic acid resin was applied to a surface of a metal substrate of stainless foil having thickness of 20 μm and then was exposed to light and developed. Thereafter, it is cured, whereby an insulating base layer of polyimide resin having thickness of 14 μm and two resin layers of polyimide resin having thickness of 14 μm and width of 0.1 mm and spaced 0.1 mm from both widthwise sides of the insulating base layer were formed in the form of a predetermined pattern.

Then, a conductor layer was formed by a semi-additive process. Specifically, a thin metal film comprising a thin chromium film having thickness of 300 Å and a thin copper film having thickness of 700 Å were formed by sputtering. Then, an electrolytic copper-plated layer having thickness of 10 μm was formed on the thin metal film thus formed. Then, the electrolytic copper-plated layer was covered with an electroless nickel-plated layer having thickness of 0.1 μm by electroless nickel plating.

Thereafter, solution of polyamic acid resin was applied to the surface of the insulating base layer in such a manner as to cover the conductor layer and then was exposed to light and developed. Thereafter, it is cured, whereby an insulating cover layer of polyimide resin having thickness of 5 μm was formed. A wired circuit board before a shield layer being formed was produced in the manner mentioned above (Cf. FIG. 1(a)).

Then, a thin metal film comprising a thin chromium film having thickness of 300 Å and a thin copper film having thickness of 700 Å was formed on the entire area of the metal substrate including the insulating cover layer and the resin layers by sputtering (Cf. FIG. 1(b)).

Thereafter, an electrolytic plated layer comprising an electrolytic nickel-plated layer having thickness of 1 μm and an electrolytic gold plated layer having thickness of 1 μm was formed on the thin conductor film by electrolytic nickel-plating and electrolytic gold plating (CF. FIG. 1(c)). Then, the wired circuit board was covered with etching resist of dry film resist in such a manner that an unwanted portion other than a shield layer forming portion thereof can be exposed (Cf. FIG. 1(d)). Thereafter, the unwanted portion exposed from the etching resist was removed by etching (FIG. 1(e)).

Then, the etching resist was removed (FIG. 1(f)). The wired circuit board having the shield layer comprising the thin conductor film and electrolytic plated layer was produced in the manner mentioned above.

Example 2

The wired circuit board before the shield layer being formed was produced in the same manner as in Example 1 (Cf. FIG. 2(a)).

Then, a thin metal film comprising a thin chromium film having thickness of 300 Å and a thin copper film having thickness of 700 Å was formed on the entire area of the metal substrate including the insulating cover layer and the resin layers by sputtering (Cf. FIG. 2(b)).

Thereafter, a plating resist of dry film resist was formed on a portion of the thin conductor film corresponding to a reversed portion of the shield layer forming portion (Cf. FIG. 2(c)). Then, an electrolytic plated layer comprising an electrolytic nickel-plated layer having thickness of 1 μm and an electrolytic gold-plated layer having thickness of 1 μm was formed by electrolytic nickel plating and electrolytic gold plating on the thin conductor film exposed from the plating resist (Cf. FIG. 2(d)). Thereafter, the plating resist was removed by chemical etching (Cf. FIG. 2(e)), and then the thin conductor film on which the plating resist had been formed was also removed by the chemical etching (Cf. FIG. 2(f)). The wired circuit board having the shield layer comprising the thin conductor film and the electrolytic plated layer was produced in the manner mentioned above.

Example 3

The wired circuit board before the shield layer being formed was produced in the same manner as in Example 1 (Cf. FIG. 3(a)).

Then, a thin metal film comprising a thin chromium film having thickness of 300 Å and a thin copper film having thickness of 700 Å was formed on the entire area of the metal substrate including the insulating cover layer and the resin layers by sputtering (Cf. FIG. 3(b)).

Then, an etching resist of dry film resist was formed on a shield layer forming portion of the thin conductor film (FIG. 3(c)). Then, the thin conductor film exposed from the etching resist was removed by chemical etching (Cf. FIG. 3(d)).

Thereafter, the etching resist was removed by chemical etching (FIG. 4(e)). Then, a plating resist of dry film resist was formed on a portion of the metal substrate corresponding to a reversed portion of the shield layer forming portion thereof (FIG. 4(f)).

Then, an electrolytic plated layer comprising an electrolytic nickel-plated layer having thickness of 1 μm and an electrolytic gold-plated layer having thickness of 1 μm was formed by electrolytic nickel plating and electrolytic gold plating on the thin conductor film exposed from the plating resist (Cf. FIG. 4(g)). Thereafter, the plating resist was removed by chemical etching (Cf. FIG. 4(h)). The wired circuit board having the shield layer comprising the thin conductor film and the electrolytic plated layer was produced in the manner mentioned above.

Example 4

The wired circuit board before the shield layer being formed was produced in the same manner as in Example 1 (Cf. FIG. 5(a)).

Then, a plating resist of dry film resist was formed on a part of the metal substrate corresponding to a reversed part of the shield layer forming part formed on the entire area of the metal substrate including the insulating cover layer and the resin layers (FIG. 5(b)).

Then, an electroless plated layer having thickness of 1 μm, serving as a ground layer, was formed by electroless nickel plating on the metal substrate including the insulating cover layer and resin layers exposed from the plating resist (FIG. 5(c)). Then, an electrolytic plated layer comprising an electrolytic nickel-plated layer having thickness of 1 μm and an electrolytic gold-plated layer having thickness of 1 μm was formed by electrolytic nickel plating and electrolytic gold plating on the electroless plated layer thus formed (Cf. FIG. 5(d)).

Thereafter, the plating resist was removed by chemical etching (Cf. FIG. 5(e)). The wired circuit board having the shield layer comprising the electroless plated layer and the electrolytic plated layer was produced in the manner mentioned above.

Example 5

The wired circuit board before the shield layer being formed was produced in the same manner as in Example 1 (Cf. FIG. 6(a)).

Then, a plating resist of dry film resist was formed on a part of the metal substrate corresponding to a reversed part of the shield layer forming part formed on the entire area of the metal substrate including the insulating cover layer and the resin layers (Cf. FIG. 6(b)). Then, an electroless plated layer having thickness of 1 μm was formed by electroless nickel plating on the metal substrate including the insulating cover layer and resin layers exposed from the plating resist (Cf. FIG. 6(c)).

Thereafter, the plating resist was removed by chemical etching (Cf. FIG. 6(d)). The wired circuit board having the shield layer comprising the electroless plated layer only was produced in the manner mentioned above.

Comparative Example 1

Solution of polyamic acid resin was applied to a surface of a metal substrate of stainless foil having thickness of 20 μm and then was exposed to light and developed. Thereafter, it is cured, whereby an insulating base layer of polyimide resin having thickness of 14 μm was formed in the form of a predetermined pattern, without any resin layer being formed.

Then, a conductor layer was formed by a semi-additive process. Specifically, a thin metal film comprising a thin chromium film having thickness of 300 Å and a thin copper film having thickness of 700 Å was formed by sputtering. Then, an electrolytic copper-plated layer having thickness of 10 μm was formed on the thin metal film thus formed. Then, the electrolytic copper-plated layer was covered with an electroless nickel-plated layer having thickness of 0.1 μm by electroless nickel plating.

Thereafter, solution of polyamic acid resin was applied to the surface of the insulating base layer in such a manner as to cover the conductor layer and then was exposed to light and developed. Thereafter, it is cured, whereby an insulating cover layer of polyimide resin having thickness of 5 μm was formed. A wired circuit board before a shield layer being formed was produced in the manner mentioned above (Cf. FIG. 7(a)/Note: like reference numerals used in FIG. 7 refer to corresponding parts of Examples described above).

Then, a thin metal film comprising a thin chromium film having thickness of 300 Å and a thin copper film having thickness of 700 Å was formed on the entire area of the metal substrate including the insulating cover layer and the resin layers by sputtering (Cf. FIG. 7(b)).

Thereafter, an electrolytic plated layer comprising an electrolytic nickel-plated layer having thickness of 1 μm and an electrolytic gold plated layer having thickness of 1 μm was formed on the thin conductor film by electrolytic nickel plating and electrolytic gold plating (CF. FIG. 7(c)). The wired circuit board having the shield layer comprising the thin conductor film and electrolytic plated layer was produced in the manner mentioned above.

Evaluation

After the completion of all processes, appearances of the wired circuit boards of Examples 1–5 and Comparative Example 1 produced in the methods described above were observed with a stereomicroscope (Magnification: 20×). The presence of stripping of the shield layers of one thousand of wired circuit boards was examined to determine an incidence rate of stripping of the shield layer, the results being that in Comparative Example 1, the incidence rate of stripping of the shield layer was 85%, whereas in all of Examples 1–5, the incidence rate of stripping of the shield layer was 0%.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board comprising:
a metal substrate;
an insulating base layer formed on the metal substrate;
a conductor layer formed on the insulating base layer;
an insulating cover layer, formed on the insulating base layer, for covering the conductor layer;
a shield layer formed of conductive material and covering the insulating cover layer and connected to the metal substrate, the shield layer being formed by plating and/or by a vacuum film-forming method; and
a resin layer formed on the metal substrate, wherein the resin layer is located spaced from the insulating base layer and the insulating cover layer at a predetermined distance, wherein the resin layer contacts the shield layer at end portions of the shield layer so that the resin layer is located between the shield layer and the metal substrate, and wherein portions of the shield layer that connect with the metal substrate are located between the resin layer and the insulating base layer.

2. The wired circuit board according to claim 1, wherein the vacuum film-forming method comprises sputtering, vacuum deposition, or ion plating.

3. The wired circuit board according to claim 1, wherein the resin layer includes at least two strips that are located a predetermined distance from the insulating cover layer.

4. The wired circuit board according to claim 3, wherein the at least two strips of resin layer are arranged parallel to the insulating cover layer in a longitudinal direction of the wired circuit board.

5. A wired circuit board comprising:
a metal substrate;
an insulating base layer formed on the metal substrate;
a conductor layer formed on the insulating base layer;
an insulating cover layer, formed on the insulating base layer, for covering the conductor layer;
a shield layer formed of conductive material and covering the insulating cover layer and connected to the metal substrate; and
a resin layer formed on the metal substrate, wherein the resin layer is located spaced from the insulating base layer and the insulating cover layer at a predetermined distance, wherein the resin layer contacts the shield layer at end portions of the shield layer so that the resin layer is located between the shield layer and the metal substrate, and wherein portions of the shield layer that connect with the metal substrate are located between the resin layer and the insulating based layer.

6. The wired circuit board according to claim 5, wherein the shield layer is formed by plating and/or by a vacuum film-forming method.

7. The wired circuit board according to claim 5, wherein the metal substrate includes a metal foil or a sheet of conductive metal.

8. The wired circuit board according to claim 5, wherein the vacuum film-forming method comprises sputtering, vacuum deposition, or ion plating.

9. The wired circuit board according to claim 5, wherein the resin layer includes at least two strips that are located a predetermined distance from the insulating cover layer.

10. The wired circuit board according to claim 9, wherein the at least two strips of resin layer are arranged parallel to the insulating cover layer in a longitudinal direction of the wired circuit board.

* * * * *